(12) United States Patent
Park et al.

(10) Patent No.: US 12,349,545 B2
(45) Date of Patent: Jul. 1, 2025

(54) DISPLAY DEVICE WITH PRIVACY MODE

(71) Applicant: Samsung Display Co., Ltd., Yongin-si (KR)

(72) Inventors: Dongwan Park, Yongin-si (KR); Jungkook Park, Cheonan-si (KR); Dohyun Kang, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 554 days.

(21) Appl. No.: 17/705,755

(22) Filed: Mar. 28, 2022

(65) Prior Publication Data

US 2022/0310734 A1  Sep. 29, 2022

(30) Foreign Application Priority Data

Mar. 29, 2021 (KR) ........................ 10-2021-0040530

(51) Int. Cl.
*G09G 3/3233* (2016.01)
*G09G 3/3241* (2016.01)
*G09G 3/3258* (2016.01)
*H10K 59/121* (2023.01)

(52) U.S. Cl.
CPC ....... *H10K 59/1216* (2023.02); *G09G 3/3233* (2013.01); *G09G 3/3241* (2013.01); *G09G 3/3258* (2013.01)

(58) Field of Classification Search
CPC ........... H10K 59/1216; H10K 59/1213; G09G 3/3233; G09G 3/3241; G09G 3/3258; G09G 2300/0819; G09G 2300/0842; G09G 2300/0861; G09G 2310/0248; G09G 2310/0251; G09G 2320/028; G09G 2320/068; G09G 3/3266
See application file for complete search history.

(56) References Cited

U.S. PATENT DOCUMENTS

2016/0133190 A1* 5/2016 Kim ..................... G09G 3/2011
345/80
2020/0394961 A1* 12/2020 Kim ..................... G09G 3/3233

FOREIGN PATENT DOCUMENTS

| KR | 101184570 B1 | 9/2012 |
| KR | 1020180047275 A | 5/2018 |
| KR | 1020190017501 A | 2/2019 |
| KR | 1020200123334 A | 10/2020 |

* cited by examiner

*Primary Examiner* — Temesghen Ghebretinsae
*Assistant Examiner* — Ivelisse Martinez Quiles
(74) *Attorney, Agent, or Firm* — CANTOR COLBURN LLP

(57) ABSTRACT

A display device includes a switching part and a first pixel circuit electrically connected to the switching part, and the switching part outputs a turn-off voltage to a first node in a first mode and outputs an initialization voltage to the first node in a second mode. The first pixel circuit includes a first transistor including a gate terminal electrically connected to the first node, a first terminal electrically connected to a second node, and a second terminal electrically connected to an organic light emitting diode and a second transistor including a gate terminal which receives a gate signal, a first terminal which receives a data voltage, and a second terminal electrically connected to the second node.

19 Claims, 14 Drawing Sheets

DISPLAY DEVICE WITH PRIVACY MODE

This application claims priority to Korean Patent Application No. 10-2021-0040530, filed on Mar. 29, 2021, and all the benefits accruing therefrom under 35 U.S.C. § 119, the content of which in its entirety is herein incorporated by reference.

BACKGROUND

1. Field

Embodiments of the invention relate generally to a display device.

2. Description of the Related Art

The demand for a personal display device capable of controlling a viewing angle of the image by a user as desired increases. The personal display device means a display in which the image is displayed at a wide viewing angle when the user operates the display device in the normal mode, and the image is displayed at a narrow viewing angle when the user operates the display device in the privacy protection mode.

SUMMARY

Conventionally, a method of additionally attaching a privacy protection film was used to implement a personal display device. However, such a method has a disadvantage that the user may directly attach and detach the privacy protection film.

Embodiments provide a display device that may actively control the viewing angle.

An embodiment of a display device includes a switching part and a first pixel circuit electrically connected to the switching part. In such an embodiment, the switching part outputs a turn-off voltage to a first node in a first mode and outputs an initialization voltage to the first node in a second mode, and the first pixel circuit includes a first transistor including a gate terminal electrically connected to the first node, a first terminal electrically connected to a second node, and a second terminal electrically connected to an organic light emitting diode and a second transistor including a gate terminal which receives a gate signal, a first terminal which receives a data voltage, and a second terminal electrically connected to the second node.

In an embodiment, the switching part may include a first switching transistor which provides the turn-off voltage to the first node in the first mode and a second switching transistor which provides the initialization voltage to the first node in the second mode.

In an embodiment, the first switching transistor may include a gate terminal which receives a turn-on voltage in the first mode, a first terminal electrically connected to the first node, and a second terminal which receives the turn-off voltage.

In an embodiment, the second switching transistor may include a gate terminal which receives the turn-on voltage in the second mode, a first terminal electrically connected to the first node, and a second terminal which receives the initialization voltage.

In an embodiment, the switching part may further include a switch, and the switch may include a first terminal which receives the turn-on voltage and a second terminal electrically connected to the gate terminal of the first switching transistor in the first mode, and electrically connected to the gate terminal of the second switching transistor in the second mode.

In an embodiment, the turn-off voltage may have a positive voltage level, and the initialization voltage may have a negative voltage level.

In an embodiment, an absolute value of a voltage level of the turn-off voltage may be greater than an absolute value of a voltage level of the initialization voltage.

In an embodiment, a voltage level of the turn-off voltage may be in a range of about 6 volts (V) to about 8 V.

In an embodiment, a voltage level of the initialization voltage may be in a range of about −4 V to about −2 V.

In an embodiment, the first transistor may be turned off in the first mode.

In an embodiment, the display device may further include a second pixel circuit, and the second pixel circuit may include a first transistor including a gate terminal which receives the initialization voltage in the first mode and the second mode, a first terminal electrically connected to a third node, and a second terminal electrically connected to an organic light emitting diode and a second transistor including a gate terminal which receives the gate signal, a first terminal which receives a data voltage, and a second terminal electrically connected to the third node.

In an embodiment, a circuit structure of the first pixel circuit may be a same as a circuit structure of the second pixel circuit.

An embodiment of a display device includes a first pixel circuit. In such an embodiment, the first pixel circuit includes a first emission transistor including a gate terminal which receives a turn-off voltage in a first mode and receives an emission driving signal in a second mode, a first terminal which receives a high power voltage, and a second terminal electrically connected to a first node. a first transistor including a gate terminal which receives an initialization voltage, a first terminal electrically connected to the first node, and a second terminal electrically connected to an organic light emitting diode through a second node, and a second transistor including a gate signal which receives a gate signal, a first terminal which receives a data voltage, and a second terminal electrically connected to the first node.

In an embodiment, the first pixel circuit may further include a second emission transistor including a gate terminal which receives the turn-off voltage in the first mode and which receives the emission driving signal in the second mode, a first terminal electrically connected to the second node, and a second terminal electrically connected the organic light emitting diode.

In an embodiment, the first emission transistor may be turned off in the first mode.

In an embodiment, the display device may further include a second pixel circuit. The second pixel circuit may include a first emission transistor including a gate terminal which receives the emission driving signal in the first mode and the second mode, a first terminal which receives the high power voltage, and a second terminal electrically connected to a third node, a first transistor including a gate terminal which receives the initialization voltage, a first terminal electrically connected to the third node, and a second terminal electrically connected to an organic light emitting diode, and a second transistor including a gate terminal which receives the gate signal, a first terminal which receives a data voltage, and a second terminal electrically connected to the third node.

In an embodiment, a circuit structure of the first pixel circuit may be a same as a circuit structure of the second pixel circuit.

An embodiment of a display device includes a first pixel circuit. In such an embodiment, the first pixel circuit includes a first transistor including a gate terminal, a first terminal electrically connected to a first node, and a second terminal electrically connected to a second node, a second transistor including a gate terminal which receives a gate signal, a first terminal which receives a data voltage, and a second terminal electrically connected to the first node, and a control transistor including a gate terminal which receives a turn-off voltage in a first mode and which receives a turn-on voltage in a second mode, a first terminal electrically connected to the second node, and a second terminal electrically connected to an organic light emitting diode.

In an embodiment, the display device may further include a second pixel circuit. The second pixel circuit may include a first transistor including a gate terminal, a first terminal electrically connected to a third node, and a second terminal electrically connected to a fourth node, a second transistor including a gate terminal which receives a gate signal, a first terminal which receives a data voltage, and a second terminal electrically connected to the third node, and an eighth transistor including a gate terminal which receives the turn-on voltage in the first mode and the second mode, a first terminal electrically connected to a fourth mode, and a second terminal electrically connected to an organic light emitting diode.

As described herein, embodiments of a display device according to the invention may be driven in the first mode and the second mode. The normal pixel may not emit light in the first mode, and the normal pixel may emit light in the second mode. Accordingly, the viewing angle of the image displayed on the display device in the first mode may be reduced, and the privacy of a user using the display device may be protected. In such embodiments, the first transistor of the normal pixel circuit may be turned off in the first mode to prevent the normal pixel from emitting light in the first mode. Accordingly, the display device may process image data in the first and second modes in a same manner as each other. Accordingly, in such embodiments, the display device may not process image data differently according to the first and second modes, such that power consumption of the display device may be reduced.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
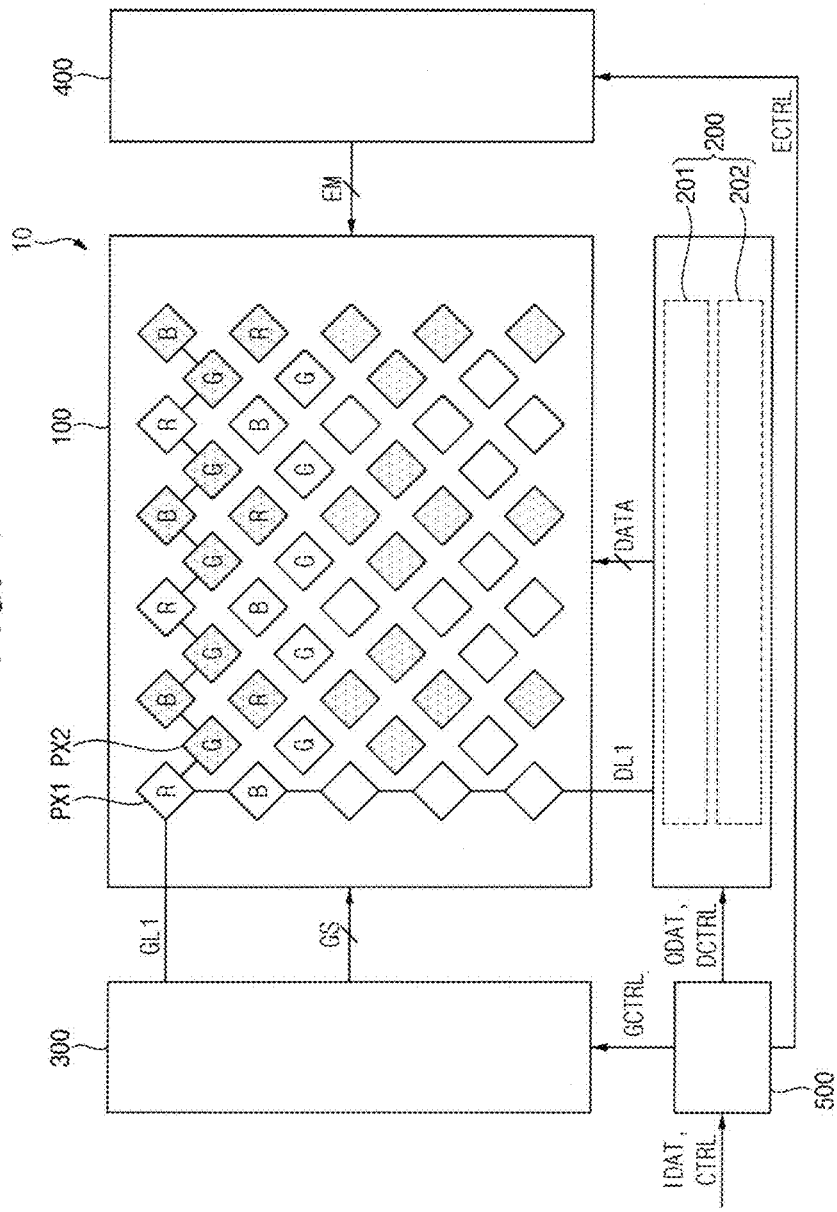
FIG. 1 is a block diagram illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. For example, "an element" has the same meaning as "at least one element," unless the context clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a block diagram illustrating a display device according to an embodiment.

Referring to FIG. 1, an embodiment of a display device 10 according to the invention may include a pixel part 100, a data driving circuit 200, a gate driver 300, an emission driver 400, and a controller 500. In an embodiment, the display device 10 may be driven in a privacy protection manner in a first mode and may be driven in a normal manner in a second mode. In one embodiment, for example, during the first mode, some pixels included in the pixel part 100 may not emit light.

The pixel part 100 may include a plurality of pixels. Each of the pixels may emit light having a preset color. In an embodiment, the pixel part 100 may have an RGBG pixel structure, and each of the pixels may emit red, green, or blue light.

In an embodiment, the pixel part 100 may include a first pixel PX1 and a second pixel PX2 adjacent to the first pixel PX1. The first pixel PX1 may emit light having a red color, and the second pixel PX2 may emit light having a green color.

In an embodiment, the pixels may be classified into normal pixels and privacy protection pixels. Each of the normal pixels and the privacy protection pixels may be partitioned in a rhombus shape. In one embodiment, for example, the first pixel PX1 may be the normal pixel, and the second pixel PX2 may be the privacy protection pixel. The first pixel PX1 may be driven through a first pixel circuit (e.g., the first pixel circuit PC1 in FIG. 2), and the second pixel PX2 may be driven through a second pixel circuit (e.g. the second pixel circuit PC2 in FIG. 4.).

In an embodiment, while the display device 10 is driven in the first mode (i.e., while the display device 10 is driven in the privacy protection mode), the first pixel PX1 may not emit light, and the second pixel PX2 may emit light. In such an embodiment, while the display device 10 is driven in the second mode (i.e., while the display device 10 is driven in the normal manner), the first pixel PX1 and the second pixel PX2 may emit light. In such an embodiment, depending on the mode in which the display device 10 is driven, the first pixel PX1 may or may not emit light.

The data driving circuit 200 may include a data voltage output part 201 and a switching part 202. In an embodiment, the data driving circuit 200 may be implemented as one or more integrated circuits ("IC"s). In an alternative embodiment, the data driving circuit 200 may be mounted on the pixel part 100 or integrated in a peripheral portion of the pixel part 100.

The data voltage output part 201 may generate the data voltage DATA based on an output image data ODAT and a data control signal DCTRL. In one embodiment, for example, the data voltage output part 201 may generate the data voltage DATA corresponding to the output image data ODAT and may output the data voltage DATA in response to the data control signal DCTRL. The data voltage output part 201 may output the data voltage DATA through a data line. In one embodiment, for example, the data voltage output part 201 may output a first data voltage (e.g. the first data voltage DATA1 in FIG. 2.) to the first pixel PX1 through a first data line DL1.

The output image data ODAT may be RGB data for an image displayed in the pixel part 100, and the data control signal DCTRL may include an output data enable signal, a horizontal start signal, and a load signal.

In an embodiment, the switching part 202 may be electrically connected to the first pixel PX1. The switching part 202 may provide a turn-off voltage in the first mode and may provide an initialization voltage in the second mode. The switching part 202 will be described later in detail with reference to FIGS. 2 and 3.

The gate driver 300 may generate a gate signal GS based on a gate control signal GCTRL. The gate signal GS may be a clock signal, and may include a turn-on voltage for turning on a transistor and a turn-off voltage for turning off the transistor. The gate driver 300 may sequentially output the gate signal GS through a gate line. In one embodiment, for example, the gate driver 300 may output the gate signal GS to the first and second pixels PX1 and PX2 through a first gate line GL1. The gate control signal GCTRL may include a vertical start signal, a clock signal, and the like. In an embodiment, the gate driver 300 may be mounted on the pixel unit 100 or integrated in a peripheral portion of the pixel unit 100. In an alternative embodiment, the gate driver 300 may be implemented as one or more integrated circuits.

The emission driver 400 may generate an emission driving signal EM based on the emission control signal ECTRL. The emission driving signal EM may be a clock signal and may include the turn-on voltage and the turn-off voltage. The emission driver 400 may sequentially output the emission driving signal EM. The emission control signal ECTRL may include a vertical start signal, a clock signal, and the like. In an embodiment, the emission driver 400 may be mounted on the pixel part 100 or integrated in a peripheral portion of the pixel part 100. In an alternative embodiment, the emission driver 400 may be implemented as one or more integrated circuits.

The controller 500 (e.g., timing controller) may receive an input image data IDAT and a control signal CTRL from an external host processor (e.g., a graphics processing unit ("GPU")). In one embodiment, for example, the input image data IDAT may be RGB data including red image data, green image data, and blue image data. The control signal CTRL may include a vertical synchronization signal, a horizontal synchronization signal, an input data enable signal, a master clock signal, and the like. The controller 500 may generate the gate control signal GCTRL, the data control signal DCTRL, and the output image data ODAT based on the input image data IDAT and the control signal CTRL.

Figure 2:
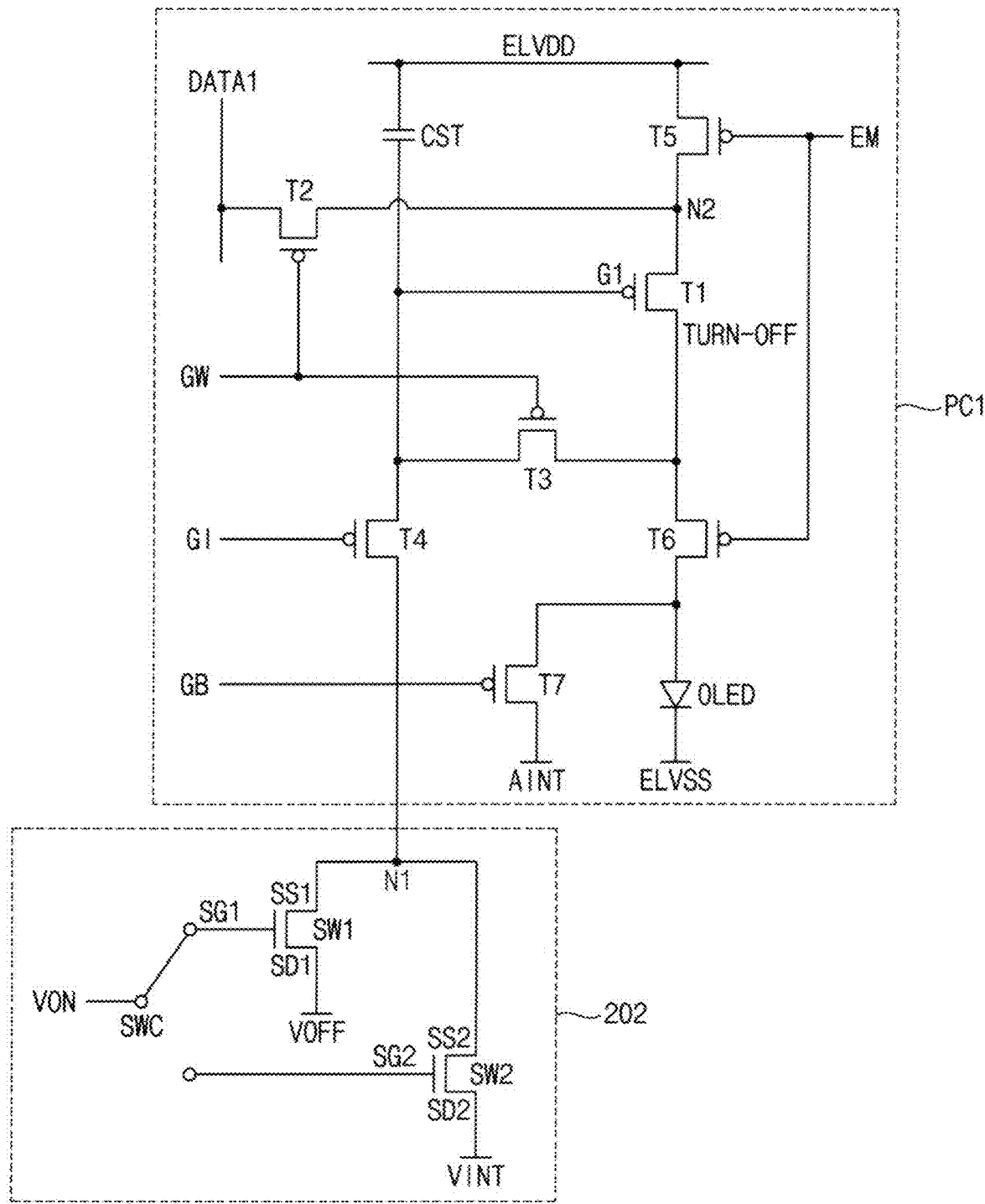
FIG. 2 and FIG. 3 are circuit diagrams illustrating a first pixel circuit and a switching part included in the display device of FIG. 1.
Figure 3:
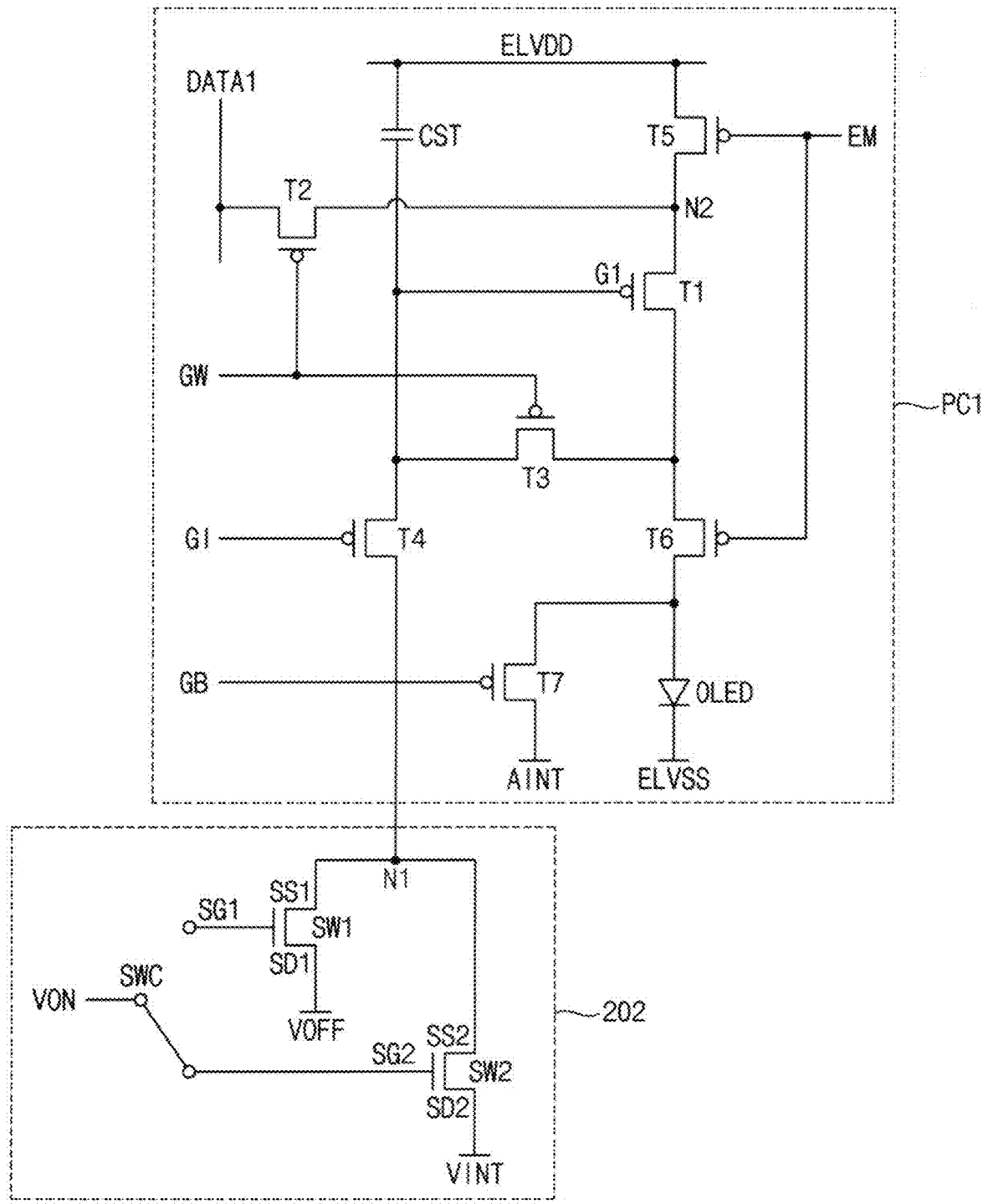

FIG. 2 and FIG. 3 are circuit diagrams illustrating a first pixel circuit and a switching part included in the display device of FIG. 1. Particularly, FIG. 2 is a circuit diagram illustrating the first pixel circuit and the switching part driven in the first mode, and FIG. 3 is a circuit diagram illustrating the first pixel circuit and the switching part driven in the second mode.

Referring to FIG. 2, the first pixel PX1 may be driven through the first pixel circuit PC1. The first pixel circuit PC1 may include a plurality of transistors, at least one capacitor, and at least one organic light emitting diode. The first pixel circuit PC1 may be electrically connected to the switching part 202 through a first node N1.

In an embodiment, the first pixel circuit PC1 may include a first transistor T1, a second transistor T2, a third transistor T3, a fourth transistor T4, a fifth transistor T5, a sixth transistor T6, a seventh transistor T7, a storage capacitor CST, and an organic light emitting diode OLED.

The first transistor T1 may include a gate terminal G1, a first terminal (e.g., a source terminal), and a second terminal (e.g., a drain terminal). The gate terminal G1 of the first transistor T1 may be electrically connected to the first node N1 (for example, the gate terminal G1 of the first transistor T1 may be electrically connected to the first node N1 through the fourth transistor T4). The first terminal of the first transistor T1 may be connected to a second node N2. The first terminal of the first transistor T1 may receive the first data voltage DATA1. The second terminal of the first transistor T1 may be electrically connected to the organic light emitting diode OLED through the sixth transistor T6. The first transistor T1 may generate a driving current based on a voltage difference between the gate terminal G1 and the second node N2.

The second transistor T2 may include a gate terminal, a first terminal (e.g., a source terminal), and a second terminal (e.g., a drain terminal). The gate terminal of the second transistor T2 may receive the first gate signal GW through the first gate line GL1.

The second transistor T2 may be turned on or off in response to the first gate signal GW. In one embodiment, for example, where the second transistor T2 is a P-channel metal-oxide-semiconductor ("PMOS") transistor, the second transistor T2 may be turned off when the first gate signal GW has a positive voltage level, and may be turned on when the first gate signal GW has a negative voltage level. The first terminal of the second transistor T2 may receive the first data voltage DATA1 through the first data line DL1. The second terminal of the second transistor T2 may provide the first data voltage DATA1 to the second node N2 while the second transistor T2 is turned on.

The third transistor T3 may include a gate terminal, a first terminal (e.g., a source terminal), and a second terminal (e.g., a drain terminal). The gate terminal of the third transistor T3 may receive the first gate signal GW. In one embodiment, for example, the first gate signal GW may be provided to the gate terminal of the second transistor T2 and the gate terminal of the third transistor T3.

The third transistor T3 may be turned on or off in response to the first gate signal GW. In one embodiment, for example, where the third transistor T3 is a PMOS transistor, the third transistor T3 may be turned on when the first gate signal GW has a negative voltage level, and may be turned off when the first gate signal GW has a positive voltage level. During a period in which the third transistor T3 is turned on in response to the first gate signal GW, the third transistor T3 may diode-connect the first transistor T1. Accordingly, the third transistor T3 may compensate for the threshold voltage of the first transistor T1.

The fourth transistor T4 may include a gate terminal, a first terminal (e.g., a source terminal), and a second terminal (e.g., a drain terminal). The gate terminal of the fourth transistor T4 may receive a second gate signal GI. The first terminal of the fourth transistor T4 may be connected to the gate terminal G1 of the first transistor T1. The second terminal of the fourth transistor T4 may be connected to the first node N1. The fourth transistor T4 may connect the gate terminal G1 of the first transistor T1 and the first node N1.

The fourth transistor T4 may be turned on or off in response to the second gate signal GI. In one embodiment, for example, where the fourth transistor T4 is a PMOS transistor, the fourth transistor T4 may be turned on when the second gate signal GI has a negative voltage level, and may be turned off when the second gate signal GI has a positive voltage level.

During a period in which the fourth transistor T4 is turned on in response to the second gate signal GI, the gate terminal G1 of the first transistor T1 may be electrically connected to the first node N1. Accordingly, the fourth transistor T4 may transfer the voltage of the first node N1 to the gate terminal G1 of the first transistor T1 in response to the second gate signal GI.

The fifth transistor T5 may include a gate terminal, a first terminal (e.g., a source terminal), and a second terminal (e.g., a drain terminal). The gate terminal of the fifth transistor T5 may receive the emission driving signal EM. The first terminal of the fifth transistor T5 may receive a high power voltage ELVDD. The second terminal of the fifth transistor T5 may be connected to the second node N2. When the fifth transistor T5 is turned on in response to the emission driving signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission driving signal EM. The first terminal of the sixth transistor T6 may be connected to the first transistor T1. The second terminal of the sixth transistor T6 may be connected to the organic light emitting diode OLED. When the sixth transistor T6 is turned on in response to the emission driving signal EM, the sixth transistor T6 may provide the driving current to the organic light emitting diode OLED.

The seventh transistor T7 may include a gate terminal, a first terminal (e.g., a source terminal), and a second terminal (e.g., a drain terminal). The gate terminal of the seventh transistor T7 may receive the third gate signal GB. The first terminal of the seventh transistor T7 may be connected to the organic light emitting diode OLED. The second terminal of the seventh transistor T7 may receive an anode initialization voltage AINT. When the seventh transistor T7 is turned on in response to the third gate signal GB, the seventh transistor T7 may provide the anode initialization voltage AINT to the organic light emitting diode OLED. Accordingly, the seventh transistor T7 may initialize the first terminal of the organic light emitting diode OLED to the anode initialization voltage AINT.

The storage capacitor CST may include a first terminal and a second terminal. The first terminal of the storage capacitor CST may be connected to the first transistor T1, and the second terminal of the storage capacitor CST may receive the high power voltage ELVDD. The storage capacitor CST may maintain the voltage level of the gate terminal G1 of the first transistor T1 during the inactivation period of the first gate signal GW.

The organic light emitting diode OLED may include a first terminal (e.g., an anode terminal) and a second terminal (e.g., a cathode terminal). The first terminal of the organic light emitting diode OLED may be connected to the sixth transistor T6 to receive the driving current, and the second terminal may receive a low power voltage ELVSS. The organic light emitting diode OLED may generate light having a luminance corresponding to the driving current.

FIG. 2 shows an embodiment of the circuit structure of the first pixel circuit PC1, and the circuit structure of the first pixel circuit PC1 may be variously changed.

In an embodiment, the switching part 202 may include a first switching transistor SW1, a second switching transistor SW2, and a switch SWC. The switching part 202 may be electrically connected to the first pixel circuit PC1 through the first node N1.

The switch SWC may include a first terminal and a second terminal. The first terminal of the switch SWC may receive a turn-on voltage VON. The second terminal of the switch SWC may be electrically connected to a gate terminal SG1 of the first switching transistor SW1 or a gate terminal SG2 of the second switching transistor SW2. In an embodiment, the second terminal of the switch SWC may be connected to the gate terminal SG1 of the first switching transistor SW1 in the first mode, and may be connected to the gate terminal SG2 of the second switching transistor SW2 in the second mode.

The first switching transistor SW1 may include the gate terminal SG1, a first terminal (e.g., a source terminal) SS1, and a second terminal (e.g., a drain terminal) SD1. The gate terminal SG1 of the first switching transistor SW1 may be electrically connected to the switch SWC. The first terminal SS1 of the first switching transistor SW1 may be connected to the first node N1. The second terminal SD1 of the first switching transistor SW1 may receive a turn-off voltage VOFF. In one embodiment, for example, the turn-off voltage VOFF may have a positive voltage level, and the voltage level of the turn-off voltage VOFF may be in a range of about 6 volts (V) to about 8V.

When the turn-on voltage VON is provided to the gate terminal SG1 of the first switching transistor SW1 in the first mode, the first switching transistor SW1 may be turned on. Accordingly, the gate terminal G1 of the first transistor T1 may receive the turn-off voltage VOFF such that the first transistor T1 may be turned off. Therefore, the first transistor T1 may not generate the driving current, and the first pixel PX1 may not emit light.

Referring to FIG. 3, the second switching transistor SW2 may include the gate terminal SG2, a first terminal (e.g., a source terminal) SS2, and a second terminal (e.g., a drain terminal) SD2. The gate terminal SG2 of the second switching transistor SW2 may be electrically connected to the switch SWC. The first terminal SS2 of the second switching transistor SW2 may be connected to the first node N1. The second terminal SD2 of the second switching transistor SW2 may receive an initialization voltage VINT. In one embodiment, for example, the initialization voltage VINT may have a negative voltage level, and the voltage level of the initialization voltage VINT may be in a range of about −4 V to about −2 V.

In an embodiment, the turn-off voltage VOFF may have a voltage level that turns off the first transistor T1. In one embodiment, for example, where the first transistor T1 is a PMOS transistor, the turn-off voltage VOFF may have a positive voltage level. As described above, the initialization voltage VINT may have a negative voltage level. In such an embodiment, the absolute value of the voltage level of the turn-off voltage VOFF may be greater than the absolute value of the voltage level of the initialization voltage VINT.

When the turn-on voltage VON is provided to the gate terminal SG2 of the second switching transistor SW2, the second switching transistor SW2 may be turned on. Accordingly, the gate terminal G1 of the first transistor T1 may receive the initialization voltage VINT such that the first transistor T1 may be initialized in response to the second gate signal GI. Therefore, the first transistor T1 may generate the driving current, and the first pixel PX1 may emit light.

Figure 4:
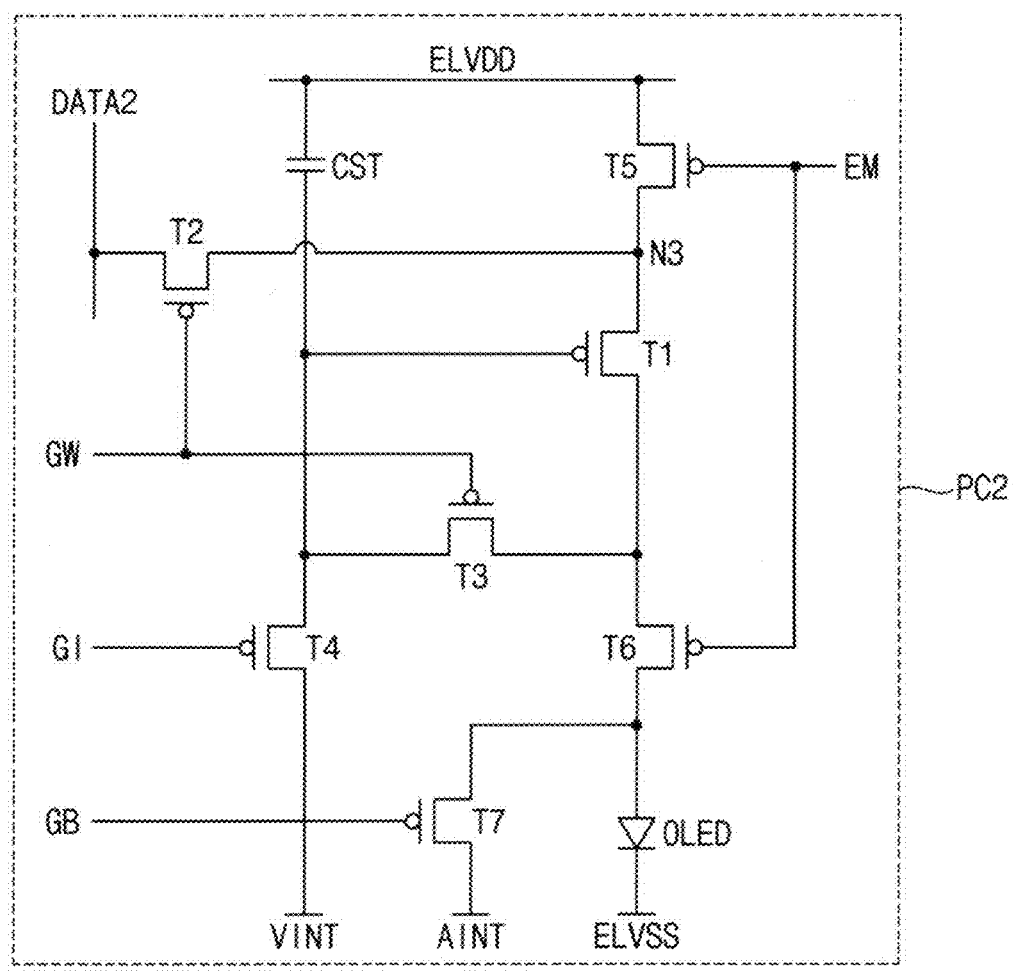
FIG. 4 is a circuit diagram illustrating a second pixel circuit included in the display device of FIG. 1.

FIG. 4 is a circuit diagram illustrating a second pixel circuit included in the display device of FIG. 1. Particularly, FIG. 4 is a circuit diagram illustrating the second pixel circuit driven in the first mode and the second mode.

Referring to FIG. 4, the second pixel PX2 may be driven through the second pixel circuit PC2. The second pixel circuit PC2 may include a plurality of transistors, at least one capacitor, and at least one organic light emitting diode. In an embodiment, the circuit structure of the second pixel circuit PC2 may be substantially the same as the circuit structure of the first pixel circuit PC1. Hereinafter, any repetitive detailed descriptions of the same or like elements of the second pixel circuit PC2 as those of the first pixel circuit PC1 will be omitted or simplified.

In an embodiment, the second pixel circuit PC2 may include a first transistor T1, a second transistor T2, a third transistor T3, a fourth transistor T4, a fifth transistor T5, a sixth transistor T6, a seventh transistor T7, a storage capacitor CST, and an organic light emitting diode OLED.

The first transistor T1 may include a gate terminal, a first terminal (e.g., a source terminal), and a second terminal (e.g., a drain terminal). The gate terminal of the first transistor T1 may be electrically connected to the storage capacitor CST. The first terminal of the first transistor T1 may be connected to a third node N3. The first terminal of the first transistor T1 may receive a second data voltage DATA2. The second terminal of the first transistor T1 may be electrically connected to the organic light emitting diode OLED through the sixth transistor T6. The first transistor T1 may generate a driving current based on a voltage difference between the gate terminal and the third node N3.

The second transistor T2 may include a gate terminal, a first terminal (e.g., a source terminal), and a second terminal (e.g., a drain terminal). The gate terminal of the second transistor T2 may receive the first gate signal GW through the first gate line GL1. The first terminal of the second transistor T2 may receive a second data voltage DATA2 through a second data line.

The second transistor T2 may be turned on or off in response to the first gate signal GW. The second transistor T2 may provide the second data voltage DATA2 to the third node N3 while the second transistor T2 is turned on.

The third to seventh transistors T3, T4, T5, T6, and T7, the storage capacitor CST, and the organic light emitting diode OLED may be substantially the same as those of the first pixel circuit PC1 described above.

Figure 5:
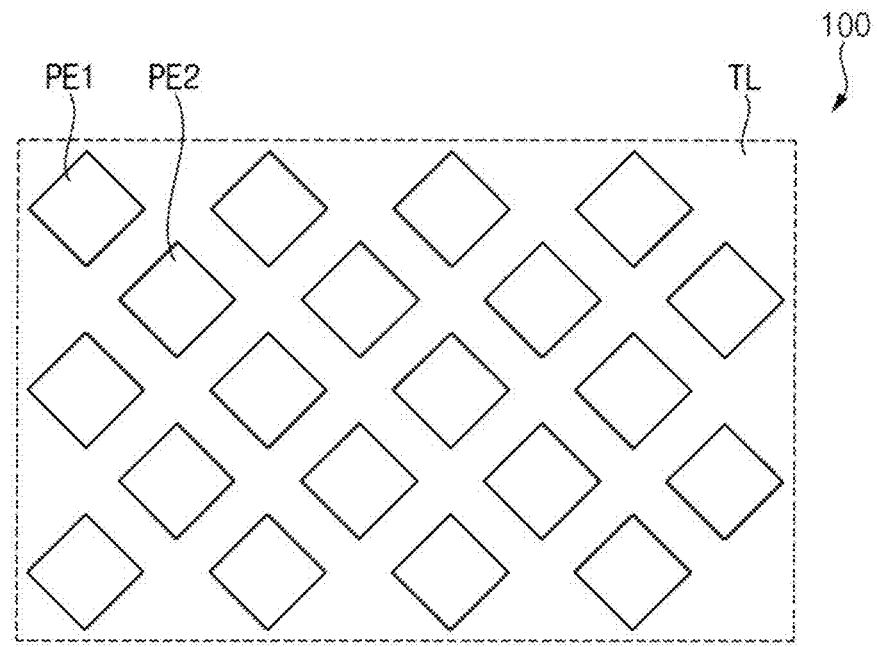
FIG. 5 and FIG. 6 are plan views illustrating a pixel part of FIG. 1.
Figure 6:
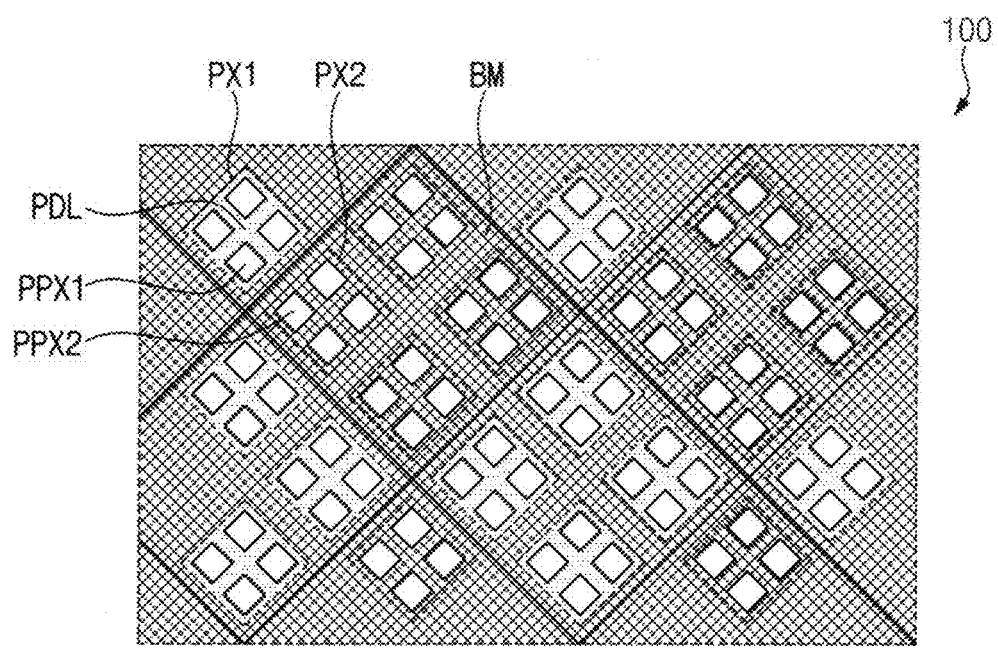
Figure 7:
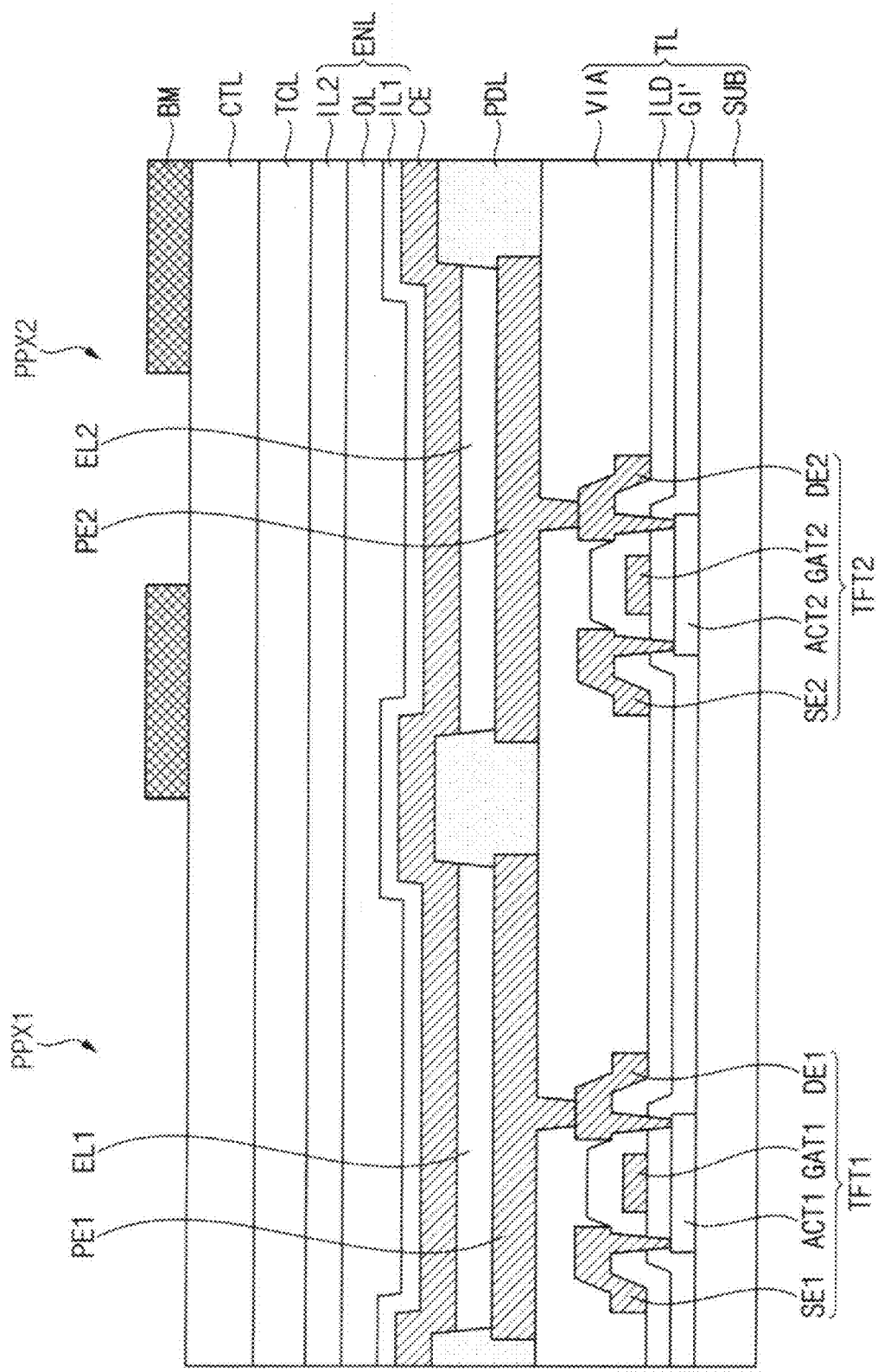
FIG. 7 is a cross-sectional view illustrating the pixel part of FIG. 6.

FIG. 5 and FIG. 6 are plan views illustrating a pixel part of FIG. 1. FIG. 7 is a cross-sectional view illustrating the pixel part of FIG. 6.

Referring to FIG. 5, the pixel part 100 may include a transistor layer TL and a plurality of pixel electrodes. In an embodiment, the pixel electrodes may be disposed or formed on the transistor layer TL and may receive the driving current from the transistor layer TL. In one embodiment, for example, the pixel electrodes may include a first pixel electrode PE1 and a second pixel electrode PE2. The first pixel electrode PE1 may be a pixel electrode (e.g., an anode electrode) for implementing the first pixel PX1, and the second pixel electrode PE2 may be a pixel electrode for implementing the second pixel PX2.

Referring to FIG. 6, the pixel part 100 may include a plurality of pixels, a pixel defining layer PDL, and a black matrix BM. In one embodiment, for example, the pixels may include the first pixel PX1 and the second pixel PX2. In an embodiment, each of the pixels may be partitioned into a plurality of partial pixels. In one embodiment, for example, the first pixel PX1 may be partitioned into four first partial pixels PPX1, and the second pixel PX2 may be partitioned into four second partial pixels PPX2.

In an embodiment, a boundary between the partial pixels may be defined by the pixel defining layer PDL. In such an embodiment, the pixel defining layer PDL may be disposed or formed between the first partial pixels PPX1, and the pixel defining layer PDL may be disposed or formed between the second partial pixels PPX2.

In an embodiment, the privacy protection pixels (e.g., the second pixel PX2) may be light-shielded. In an embodiment, the black matrix BM may be further disposed or formed between the second partial pixels PPX2. In an alternative embodiment, the pixel defining layer PDL disposed or formed between the second partial pixels PPX2 may block light.

Referring to FIG. 7, the pixel part 100 may include a substrate SUB, a first active pattern ACT1, a second active pattern ACT2, a gate insulating layer GI', a first gate electrode GAT1, and a second gate electrode GAT2, an interlayer insulating layer ILD, a first source electrode SE1, a first drain electrode DE1, a second source electrode SE2, a second drain electrode DE2, a via insulating layer VIA, the first pixel electrode PE1, the second pixel electrode PE2, the pixel defining layer PDL, a first emission layer EL1, a second emission layer EL2, a common electrode CE, a first inorganic layer IL1, an organic layer OL, a second inorganic layer IL2, a sensing layer TCL, a light collection layer CTL, and the black matrix BM. In one embodiment, for example, the transistor layer TL may include the substrate SUB, the first active pattern ACT1, the second active pattern ACT2, the gate insulating layer GI', the first gate electrode GAT1, the second gate electrode GAT2, the interlayer insulating layer ILD, the first source electrode SE1, the first drain electrode DE1, the second source electrode SE2, the second drain electrode DE2, and the via insulating layer VIA.

The substrate SUB may include or be formed of a transparent or opaque material. In one embodiment, for example, the substrate SUB may include or be formed of glass, quartz, plastic, or the like. In an embodiment where the substrate SUB is formed of plastic, the substrate SUB may include a plurality of polyimide layers and barrier layers disposed between the polyimide layers.

The first active pattern ACT1, the first gate electrode GAT1, the first source electrode SE1, and the first drain electrode DE1 may constitute a first thin film transistor TFT1. In one embodiment, for example, the first thin film transistor TFT1 may correspond to any one of the first to seventh transistors T1, T2, T3, T4, T5, T6, and T7 of the first pixel circuit PC1 described above with reference to FIGS. 2 and 3.

The second active pattern ACT2, the second gate electrode GAT2, the second source electrode SE2, and the second drain electrode DE2 may constitute a second thin film transistor TFT2. In one embodiment, for example, the second thin film transistor TFT2 may correspond to any one of the first to seventh transistors T1, T2, T3, T4, T5, T6, and T7 of the second pixel circuit PC2 described above with reference to FIG. 4.

The first and second active patterns ACT1 and ACT2 may be disposed on the substrate SUB. In an embodiment, the first and second active patterns ACT1 and ACT2 may include a silicon semiconductor. In one embodiment, for example, the first and second active patterns ACT1 and ACT2 may include amorphous silicon, polycrystalline silicon, or the like. In an alternative embodiment, the first and second active patterns ACT1 and ACT2 may include an oxide semiconductor.

The gate insulating layer GI' may cover the first and second active patterns ACT1 and ACT2 and may be disposed on the substrate SUB. The gate insulating layer GI' may include an inorganic insulating material. In one embodiment, for example, the gate insulating layer GI' may include silicon oxide, silicon nitride, silicon oxynitride, or the like.

The first and second gate electrodes GAT1 and GAT2 may be disposed on the gate insulating layer GI'. The first and second gate electrodes GAT1 and GAT2 may include a metal, an alloy, a conductive metal oxide, a transparent conductive material, or the like. In one embodiment, for example, the first and second gate electrodes GAT1 and GAT2 may include at least one selected from silver (Ag), an alloy containing silver, molybdenum (Mo), an alloy containing molybdenum, aluminum (Al), alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), and the like.

The interlayer insulating layer ILD may cover the first and second gate electrodes GAT1 and GAT2 and may be disposed on the gate insulating layer GI'. The interlayer insulating layer ILD may include an inorganic insulating material.

The first source electrode SE1, the first drain electrode DE1, the second source electrode SE2, and the second drain electrode DE2 may be disposed on the interlayer insulating layer ILD. In an embodiment, the first source electrode SE1 and the first drain electrode DE1 may contact the first active pattern ACT1, and the second source electrode SE2 and the second drain electrode DE2 may contact the second active pattern ACT2. The first source electrode SE1, the first drain electrode DE1, the second source electrode SE2, and the second drain electrode DE2 may include or be formed of a metal, an alloy, a conductive metal oxide, a transparent conductive material, or the like.

The via insulating layer VIA may cover the first source electrode SE1, the first drain electrode DE1, the second source electrode SE2, and the second drain electrode DE2, and may be disposed on the interlayer insulating layer ILD. The via insulating layer VIA may include an organic insulating material. In one embodiment, for example, the via insulating layer VIA may include a photoresist, a polyacrylic resin, a polyimide resin, an acrylic resin, or the like. Accordingly, the via insulating layer VIA may have a substantially flat top surface.

The first pixel electrode PE1 and the second pixel electrode PE2 may be disposed on the via insulating layer VIA. In an embodiment, the first pixel electrode PE1 may contact the first drain electrode DE1, and the second pixel electrode PE2 may contact the second drain electrode DE2. The first pixel electrode PE1 and the second pixel electrode PE2 may include a reflective metal material or a transparent metal material. In one embodiment, for example, the first pixel electrode PE1 and the second pixel electrode PE2 may include at least one selected from silver (Ag), an alloy containing silver, molybdenum (Mo), an alloy containing molybdenum, aluminum ("Al"), alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, and the like. In an embodiment, the first pixel electrode PE1 and the second pixel electrode PE2 may have a multilayer structure of ITO/Ag/ITO.

The pixel defining layer PDL may cover end portions of the first pixel electrode PE1 and the second pixel electrode PE2 and may be disposed on the via insulating layer VIA. The pixel defining layer PDL may include an organic material. Openings exposing the first pixel electrode PE1 and the second pixel electrode PE2 may be defined or formed in the pixel defining layer PDL.

The first emission layer EL1 may be disposed on the first pixel electrode PE1, and the second emission layer EL2 may be disposed on the second pixel electrode PE2. In one embodiment, for example, the first and second emission layers EL1 and EL2 may be respectively disposed in the openings. The first emission layer EL1 may generate light based on a voltage difference between the first pixel electrode PE1 and the common electrode CE, and the second emission layer EL2 may be generate light based on a voltage difference between the second pixel electrode PE2 and the common electrode CE. In an embodiment, the first and second emission layers EL1 and EL2 may include functional layers (e.g., a hole injection layer, a hole transport layer, an electron transport layer, electron injection layer, etc.) to increase the luminous efficiency of the first and second emission layers EL1 and EL2.

The common electrode CE may be disposed on the first and second emission layers EL1 and EL2. The common electrode CE may be formed in a plate shape and may include a reflective metal material or a transparent metal material.

The first inorganic layer IL1, the organic layer OL, and the second inorganic layer IL2 may constitute an encapsulation layer ENL. The encapsulation layer ENL may be disposed on the common electrode CE. The encapsulation layer ENL may protect the first and second emission layers EL1 and EL2.

The sensing layer TCL may be disposed on the encapsulation layer ENC. The sensing layer TCL may sense a user's touch or non-contact touch. In one embodiment, for example, the sensing layer TCL may sense a user's touch in a capacitive manner. In one embodiment, for example, the sensing layer TCL may sense a user's touch using a self-capacitance method or a mutual capacitance method.

The light collection layer CTL may be disposed on the sensing layer TCL. In an embodiment, the light collection layer CTL may include a plurality of micro lenses. Accordingly, the light collection layer CTL may control a path of light emitted from the first and second emission layers EL1 and EL2 in the thickness direction of the light collection layer CTL.

The black matrix BM may be disposed on the light collection layer CTL. The black matrix BM may block light. In one embodiment, for example, the light transmittance of the black matrix BM may be changed according to the first mode or the second mode.

In an embodiment, the black matrix BM may be implemented as an electrochromic device. In one embodiment, for example, the black matrix BM may include an anode, a cathode, and an electrochromic material disposed between the cathode and the anode. The light transmittance of the black matrix BM may be changed by an electrical signal. In one embodiment, for example, the first light transmittance of the black matrix BM in the first mode may be smaller than the second light transmittance of the black matrix BM in the second mode. Accordingly, a viewing angle of light emitted from the second emission layer EL2 in the first mode may be reduced.

In an alternative embodiment, the black matrix BM may include a photochromic material. In one embodiment, for example, the black matrix BM may be discolored by light having a specific wavelength range (e.g., ultraviolet light). In such an embodiment, as the black matrix BM is discolored, the light transmittance of the black matrix BM may be changed. In one embodiment, for example, the first light transmittance of the black matrix BM in the first mode may be smaller than the second light transmittance of the black matrix BM in the second mode. Accordingly, a viewing angle of light emitted from the second emission layer EL2 in the first mode may be reduced.

However, the black matrix BM is not limited to those described above. In one embodiment, for example, the black matrix BM may have a constant light transmittance, and an emission angle of light emitted from the second emission layer EL2 may be reduced by the black matrix BM.

Figure 8:
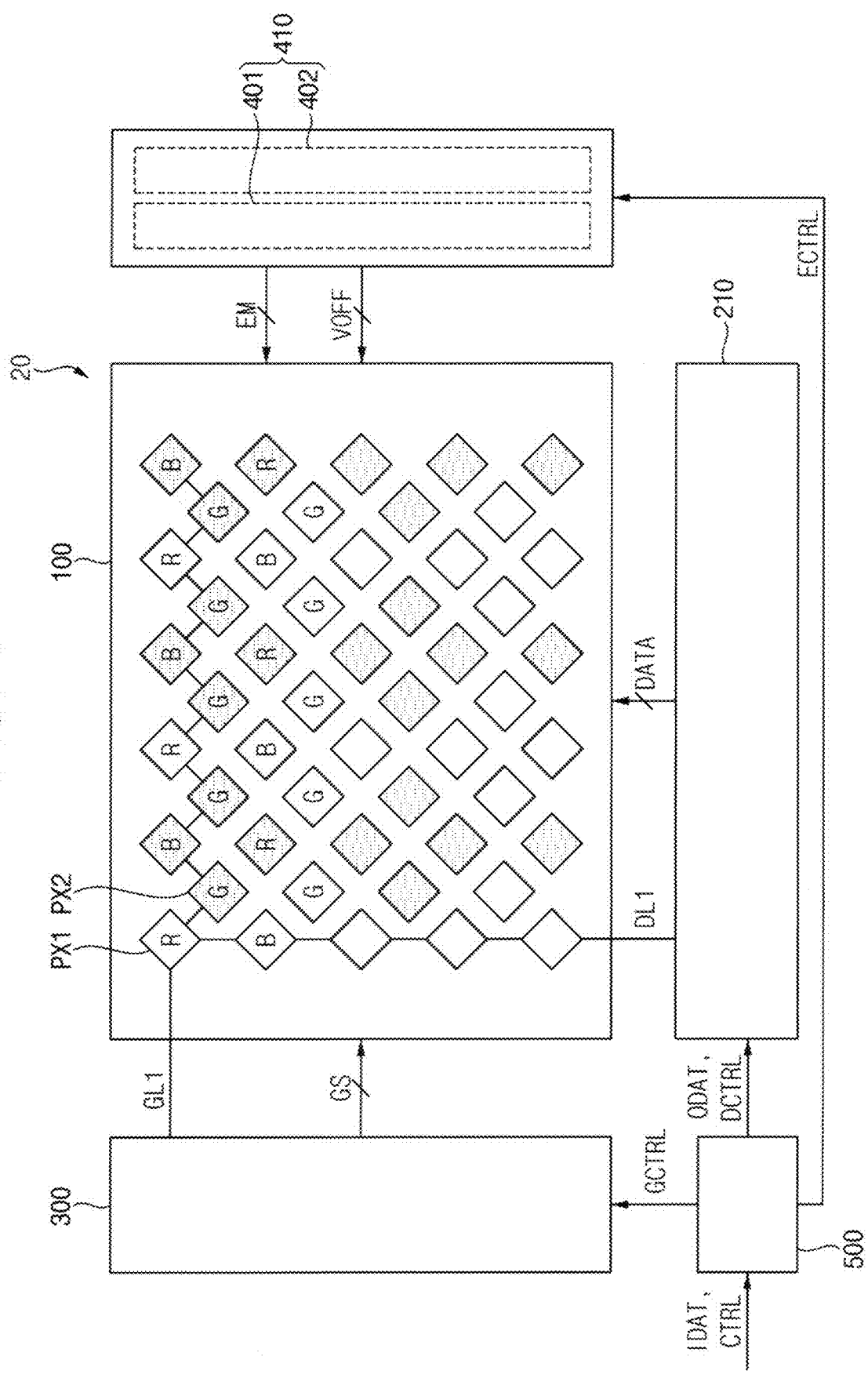
FIG. 8 is a block diagram illustrating a display device according to an alternative embodiment.

FIG. 8 is a block diagram illustrating a display device according to an alternative embodiment.

Referring to FIG. 8, an embodiment of a display device may include a pixel part 100, a data voltage output part 210, a gate driver 300, a emission driver 410, and a controller 500. In an embodiment, the display device 20 may be driven in the privacy protection manner in the first mode and may be driven in the normal manner in the second mode. In one embodiment, for example, in the first mode, some pixels included in the pixel part 100 may not emit light.

The pixel part 100, the gate driver 300, and the controller 500 may be substantially the same as the pixel part 100, the gate driver 300, and the controller 500 described with reference to FIG. 1. The data voltage output part 210 may be substantially the same as the data voltage output part 201 described with reference to FIG. 1.

In an embodiment, the emission driver 410 may include a first emission driver 401 and a second emission driver 402. The emission driver 410 may be mounted on the pixel part 100 or integrated in a peripheral portion of the pixel part 100. Alternatively, the emission driver 410 may be implemented as one or more integrated circuits.

The first emission driver 401 may be electrically connected to a first pixel circuit PC1 that drives the first pixel PX1. The first emission driver 401 may provide a turn-off voltage VOFF in the first mode and may provide an emission driving signal EM in the second mode. Accordingly, the first pixel circuit PC1 may receive the turn-off voltage VOFF in the first mode and may receive the emission driving signal EM in the second mode. The turn-off voltage VOFF may be a constant voltage, and the emission driving signal EM may be a clock signal including the turn-off voltage and the turn-on voltage. In one embodiment, for example, in the second mode, the first emission driver 401 may generate the emission driving signal EM based on the emission control signal ECTRL. The emission control signal ECTRL may include a vertical start signal, a clock signal, and the like.

The second emission driver 402 may be electrically connected to a second pixel circuit PC2 that drives the second pixel PX2. The second emission driver 402 may provide the emission driving signal EM to the second pixel circuit PC2 in the first mode and the second mode. Accordingly, the second pixel circuit PC2 may receive the emission driving signal EM in the first mode and the second mode.

Figure 9:
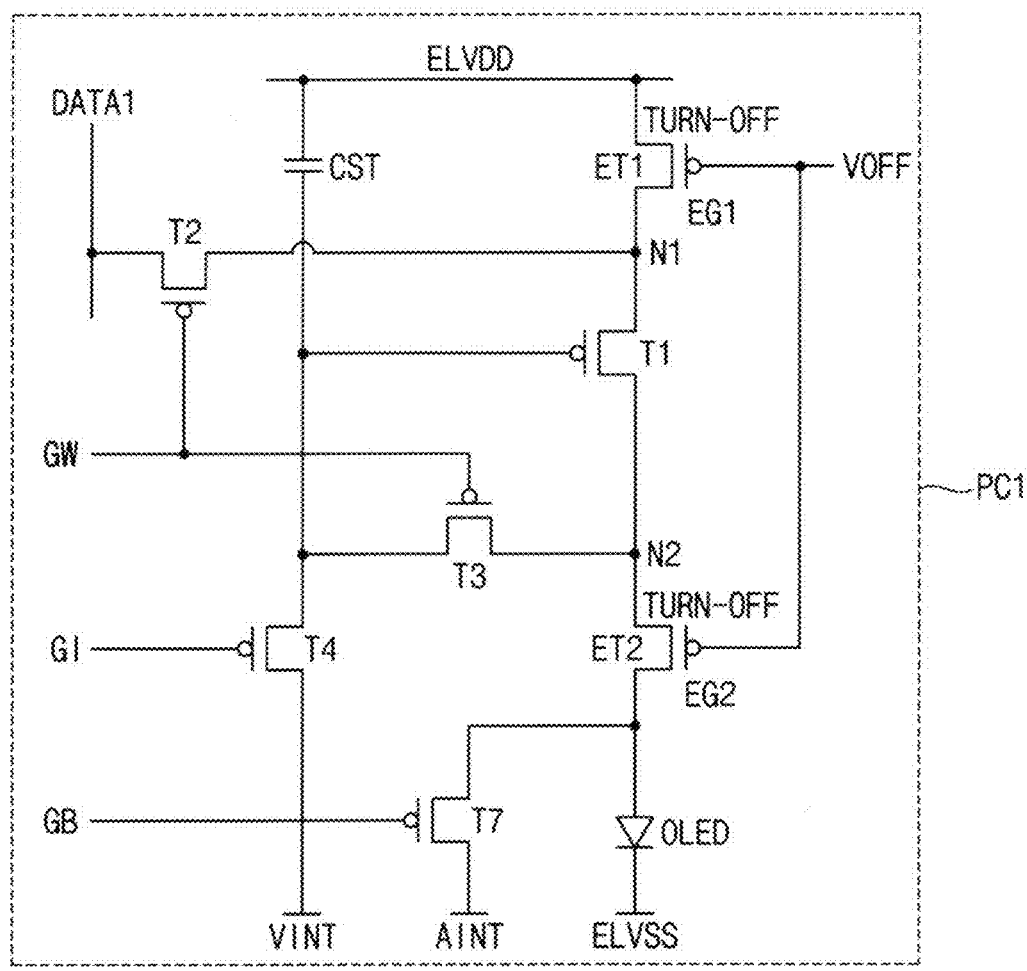
FIG. 9 and FIG. 10 are circuit diagrams illustrating a first pixel circuit and a switching part included in the display device of FIG. 8.
Figure 10:
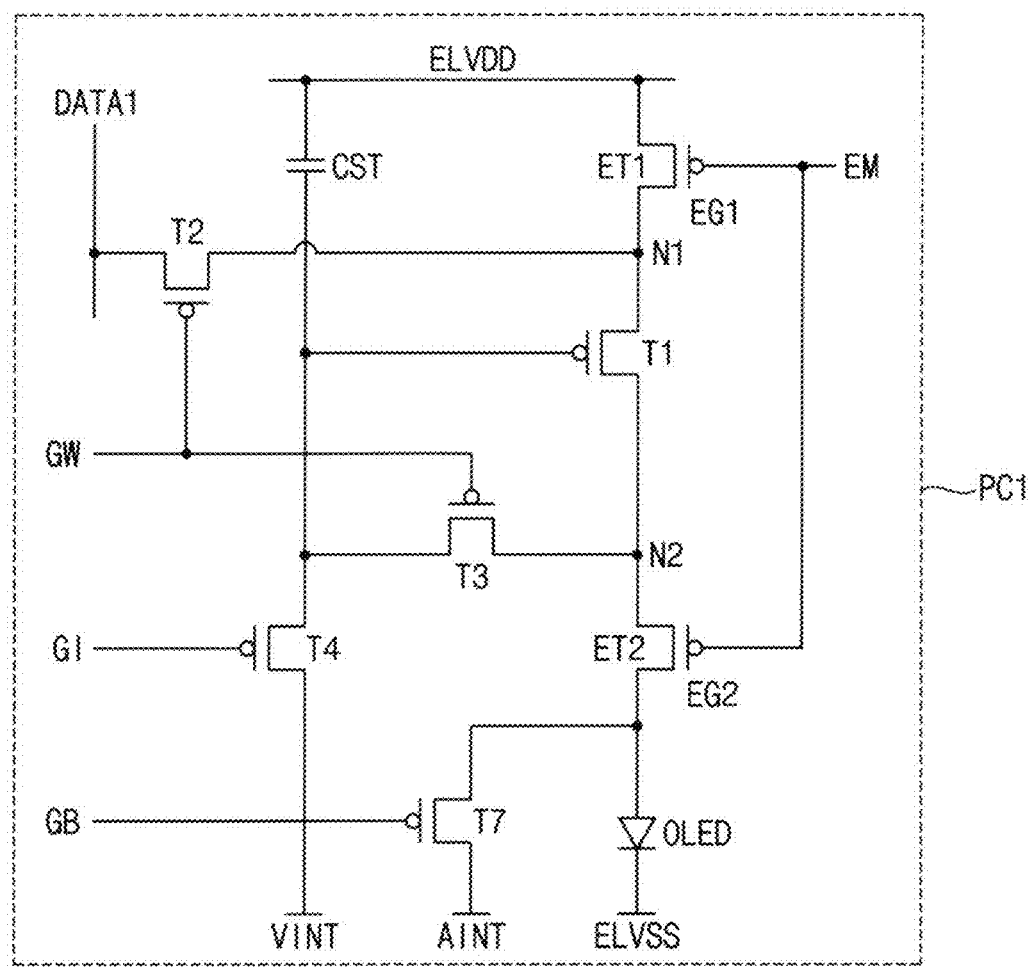

FIG. 9 and FIG. 10 are circuit diagrams illustrating a first pixel circuit and a switching part included in the display device of FIG. 8. Particularly, FIG. 9 is a circuit diagram illustrating the first pixel circuit driven in the first mode, and FIG. 10 is a circuit diagram illustrating the first pixel circuit driven in the second mode.

Referring to FIG. 9, the first pixel PX1 may be driven through the first pixel circuit PC1. The first pixel circuit PC1 may include a plurality of transistors, at least one capacitor, and at least one organic light emitting diode.

In an embodiment, the first pixel circuit PC1 may include a first transistor T1, a second transistor T2, a third transistor T3, a fourth transistor T4, a first emission transistor ET1, a second emission transistor ET2, a seventh transistor T7, a storage capacitor CST, and an organic light emitting diode OLED. In such an embodiment, the second transistor T2, the third transistor T3, the fourth transistor T4, the seventh transistor T7, the storage capacitor CST, and the organic light emitting diode OLED may be substantially the same as described above with reference to FIGS. 2 and 3.

The first transistor T1 may include a gate terminal, a first terminal (e.g., a source terminal), and a second terminal (e.g., a drain terminal). The gate terminal of the first transistor T1 may be electrically connected to the storage capacitor CST. The first terminal of the first transistor T1 may be connected to a first node N1. The first terminal of the first transistor T1 may receive the first data voltage DATA1. The second terminal of the first transistor T1 may be electrically connected to the organic light emitting diode OLED through a second node N2 (for example, the second terminal of the first transistor T1 may be connected to the second node N2 and may be electrically connected to the organic light emitting diode OLED through the second emission transistor ET2). The first transistor T1 may generate a driving current based on a voltage difference between the gate terminal and the first node N1.

The first emission transistor ET1 may include a gate terminal EG1, a first terminal (e.g., a source terminal), and a second terminal (e.g., a drain terminal). The gate terminal EG1 of the first emission transistor ET1 may receive the turn-off voltage VOFF in the first mode. The first terminal of the first emission transistor ET1 may receive the high power voltage ELVDD. The second terminal of the first emission transistor ET1 may be connected to the first node N1.

The second emission transistor ET2 may include a gate terminal EG2, a first terminal (e.g., a source terminal), and a second terminal (e.g., a drain terminal). The gate terminal EG2 of the second emission transistor ET2 may receive the turn-off voltage VOFF in the first mode. The first terminal of the second emission transistor ET2 may be electrically connected to the second node N2. The second terminal of the second emission transistor ET2 may be connected to the organic light emitting diode OLED.

When the turn-off voltage VOFF is provided to the gate terminal EG1 of the first emission transistor ET1 and the gate terminal EG2 of the second emission transistor ET2 in the first mode, the first emission transistor ET1 and the second emission transistor ET2 may be turned off. Accordingly, the first pixel PX1 may not emit light.

Referring to FIG. 10, the gate terminal EG1 of the first emission transistor ET1 and the gate terminal EG2 of the second emission transistor ET2 may receive the emission driving signal EM in the second mode. When the emission driving signal EM is provided to the gate terminal EG1 of the first emission transistor ET1 and the gate terminal EG2 of the second emission transistor ET2, the first emission transistor ET1 and the second emission transistor ET2 may be turned on or off. While the first emission transistor ET1 and the second emission transistor ET2 are turned on, the first pixel PX1 may emit light.

Figure 11:
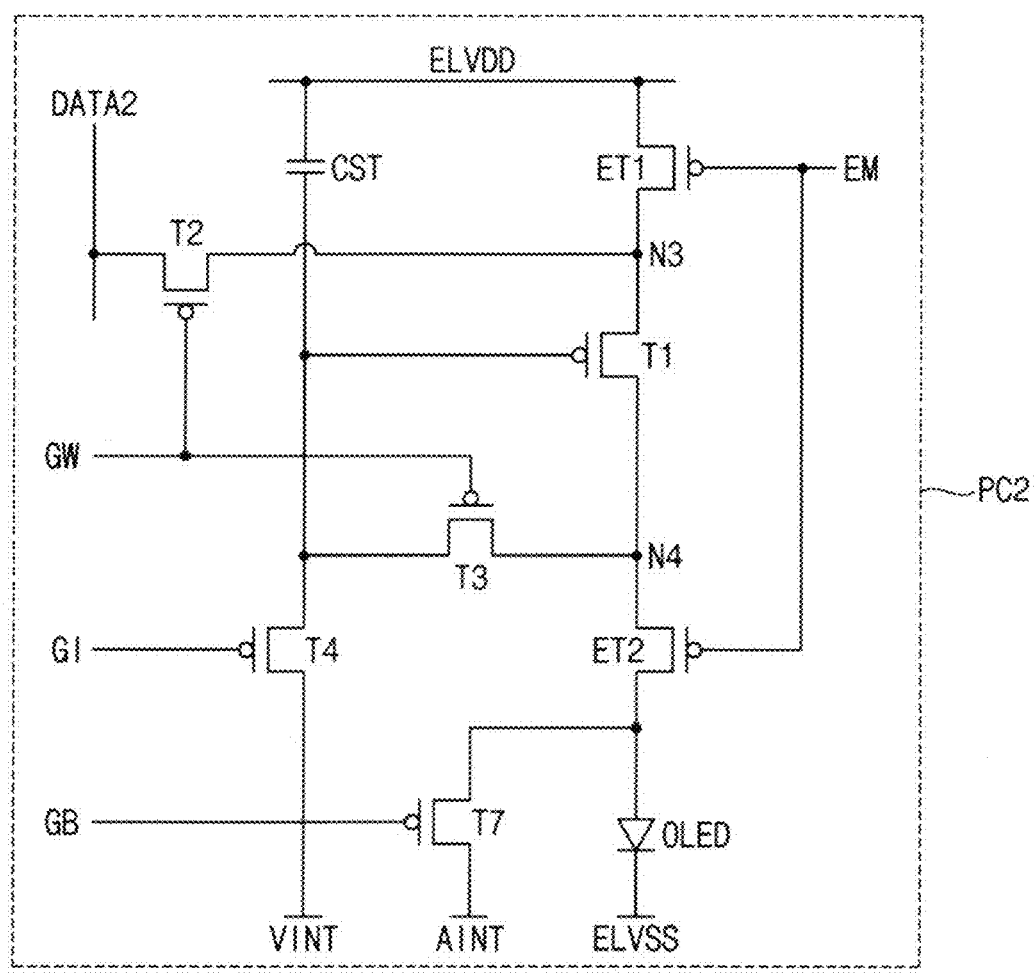
FIG. 11 is a circuit diagram illustrating a second pixel circuit included in the display device of FIG. 8.

FIG. 11 is a circuit diagram illustrating a second pixel circuit included in the display device of FIG. 8. Particularly, FIG. 11 is a circuit diagram illustrating the second pixel circuit driven in the first mode and the second mode.

Referring to FIG. 11, the second pixel PX2 may be driven through the second pixel circuit PC2. The second pixel circuit PC2 may include a plurality of transistors, at least one capacitor, and at least one organic light emitting diode. In an embodiment, the circuit structure of the second pixel circuit PC2 may be substantially the same as the circuit structure of the first pixel circuit PC1. Hereinafter, any repetitive description of the same or like elements of the second pixel circuit PC2 as those of the first pixel circuit PC1 will be omitted or simplified.

In an embodiment, the second pixel circuit PC2 may include a first transistor T1, a second transistor T2, a third transistor T3, a fourth transistor T4, a first emission transistor ET1, a second emission transistor ET2, a seventh transistor T7, a storage capacitor CST, and an organic light emitting diode OLED.

The first transistor T1 may include a gate terminal, a first terminal (e.g., a source terminal), and a second terminal (e.g., a drain terminal). The gate terminal of the first transistor T1 may be electrically connected to the storage capacitor CST. The first terminal of the first transistor T1 may be connected to a third node N3. The first terminal of the first transistor T1 may receive the second data voltage DATA2. The second terminal of the first transistor T1 may be electrically connected to the organic light emitting diode OLED through a fourth node N4 (for example, the second terminal of the first transistor T1 may be connected to the fourth node N4 and may be electrically connected to the organic light emitting diode OLED through the second emission transistor ET2). The first transistor T1 may generate a driving current based on a voltage difference between the gate terminal and the third node N3.

The first emission transistor ET1 may include a gate terminal, a first terminal (e.g., a source terminal), and a second terminal (e.g., a drain terminal). The gate terminal of the first emission transistor ET1 may receive the emission driving signal EM in the first mode and the second mode. The first terminal of the first emission transistor ET1 may receive the high power voltage ELVDD. The second terminal of the first emission transistor ET1 may be connected to the third node N3.

The second emission transistor ET2 may include a gate terminal, a first terminal (e.g., a source terminal), and a second terminal (e.g., a drain terminal). The gate terminal of the second emission transistor ET2 may receive the emission driving signal EM in the first mode and the second mode. The first terminal of the second emission transistor ET2 may be electrically connected to the fourth node N4. The second terminal of the second emission transistor ET2 may be connected to the organic light emitting diode OLED.

When the emission driving signal EM is provided to the gate terminal of the first emission transistor ET1 and the gate terminal of the second emission transistor ET2 in the first mode and the second mode, the first emission transistor ET1 and the second emission transistor ET2 may be turned on or off. While the first emission transistor ET1 and the second emission transistor ET2 are turned on, the second pixel PX2 may emit light.

Figure 12:
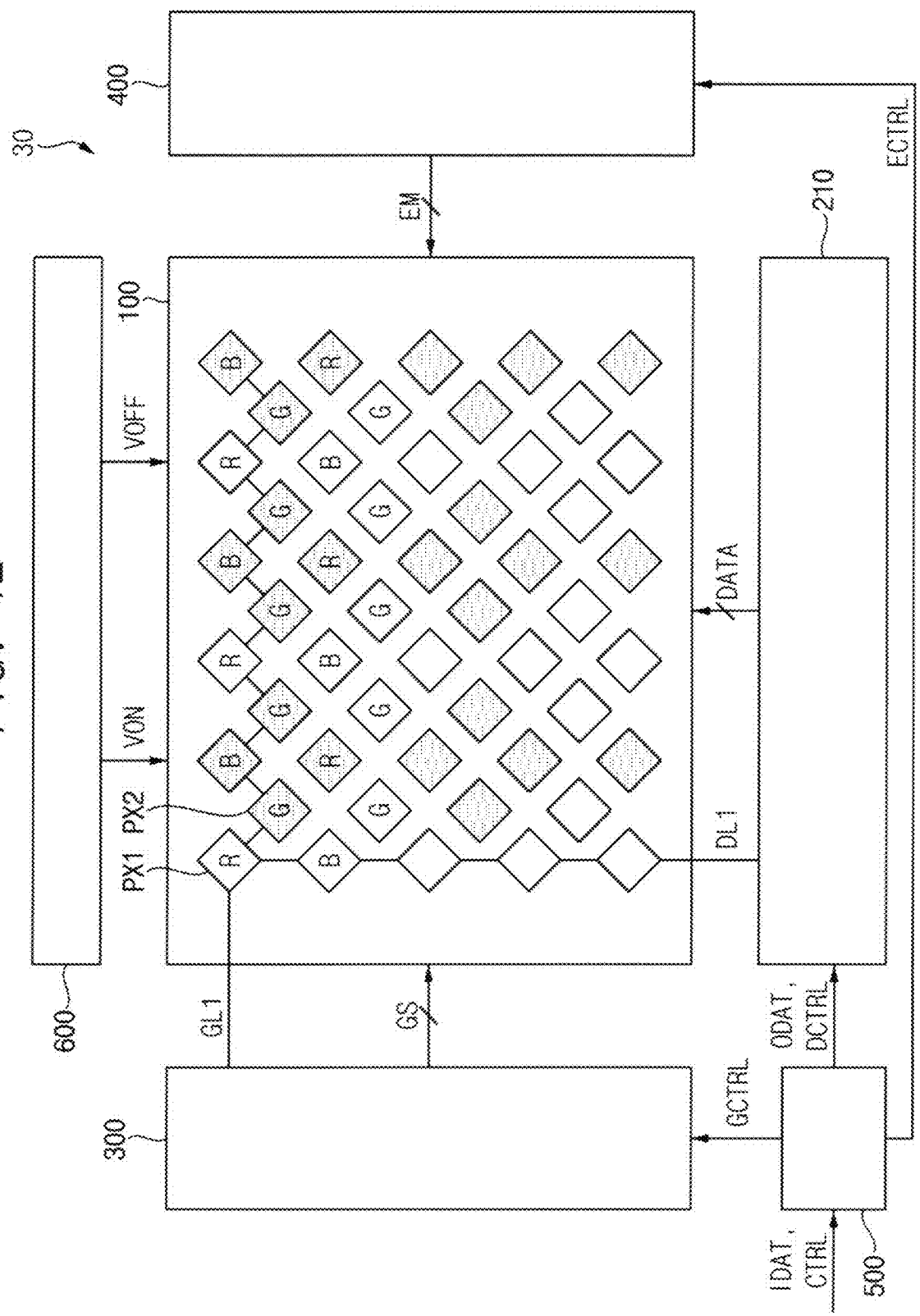
FIG. 12 is a block diagram illustrating a display device according to another alternative embodiment.

FIG. 12 is a block diagram illustrating a display device according to another alternative embodiment.

Referring to FIG. 12, an embodiment of a display device 30 may include a pixel part 100, a data voltage output part 210, a gate driver 300, an emission driver 400, a controller 500, and an on-off control part 600. In an embodiment, the display device 30 may be driven in the privacy protection manner in the first mode and may be driven in the normal manner in the second mode. In one embodiment, for example, in the first mode, some pixels included in the pixel part 100 may not emit light.

The pixel part 100, the data voltage output part 210, the gate driver 300, the emission driver 400, and the controller 500 may be substantially the same as the pixel part 100, the data voltage output part 201, the gate driver 300, the emission driver 400, and the controller 500 described above with reference to FIG. 1.

In an embodiment, the on-off control part 600 may be electrically connected to the first pixel PX1. The on-off control part 600 may provide the turn-off voltage VOFF to the first pixel PX1 in the first mode, and may provide the turn-on voltage VON to the first pixel PX1 in the second mode.

Figure 13:
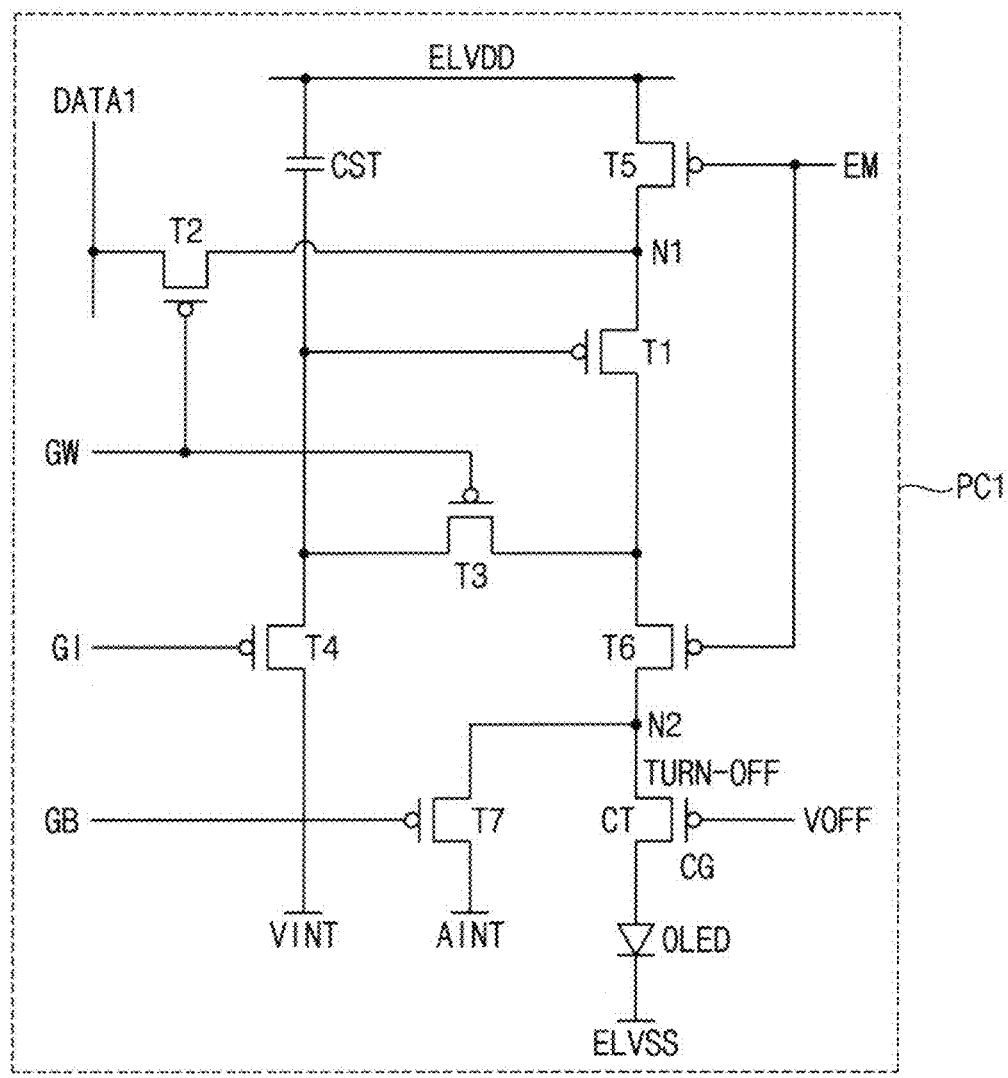
FIG. 13 and FIG. 14 are circuit diagrams illustrating a first pixel circuit included in the display device of FIG. 12.
Figure 14:
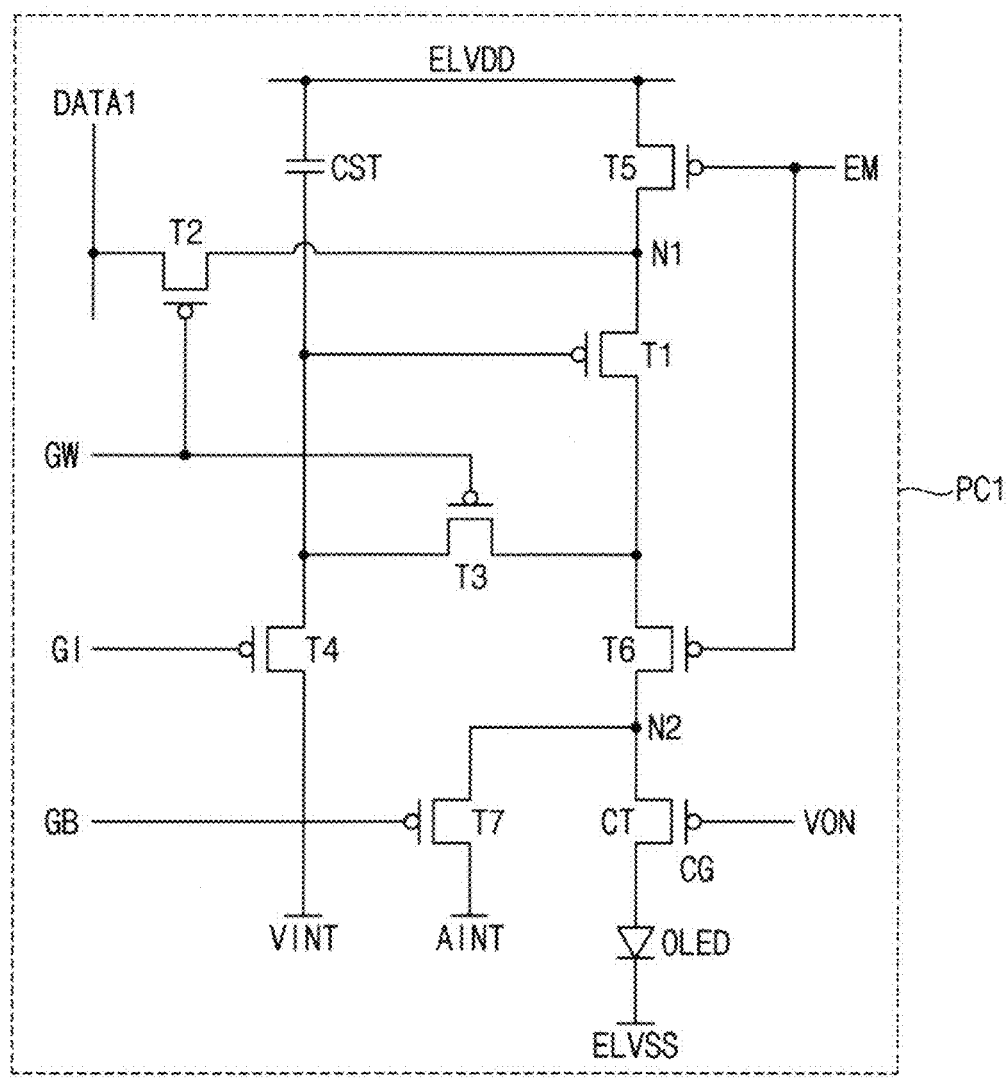

FIG. 13 and FIG. 14 are circuit diagrams illustrating a first pixel circuit included in the display device of FIG. 12. Particularly, FIG. 13 is a circuit diagram illustrating the first pixel circuit driven in the first mode, and FIG. 14 is a circuit diagram illustrating the first pixel circuit driven in the second mode.

Referring to FIG. 13, the first pixel PX1 may be driven through the first pixel circuit PC1. The first pixel circuit PC1 may include a plurality of transistors, at least one capacitor, and at least one organic light emitting diode.

In an embodiment, the first pixel circuit PC1 may include a first transistor T1, a second transistor T2, a third transistor T3, a fourth transistor T4, a fifth transistor T5, a sixth transistor T6, a seventh transistor T7, a control transistor CT, a storage capacitor CST, and an organic light emitting diode OLED. In such an embodiment, the second transistor T2, the third transistor T3, the fourth transistor T4, the seventh transistor T7, the storage capacitor CST, and the organic light emitting diode OLED may be substantially the same as those described above with reference to FIGS. 2 and 3.

The first transistor T1 may include a gate terminal, a first terminal (e.g., a source terminal), and a second terminal (e.g., a drain terminal). The gate terminal of the first transistor T1 may be electrically connected to the storage capacitor CST. The first terminal of the first transistor T1 may be connected to a first node N1. The first terminal of the first transistor T1 may receive the first data voltage DATA1. The second terminal of the first transistor T1 may be electrically connected to the organic light emitting diode OLED through a second node N2 (for example, the second terminal of the first transistor T1 may be connected to the second node N2 and may be electrically connected to the organic light emitting diode OLED through the sixth transistor T6 and the control transistor CT). The first transistor T1 may generate a driving current based on a voltage difference between the gate terminal and the first node N1.

The control transistor CT may include a gate terminal CG, a first terminal (e.g., a source terminal), and a second terminal (e.g., a drain terminal). The gate terminal CG of the control transistor CT may receive the turn-off voltage VOFF in the first mode. The first terminal of the control transistor CT may be connected to the second node N2. The second terminal of the control transistor CT may be connected to the organic light emitting diode OLED.

When the turn-off voltage VOFF is provided to the gate terminal CG of the control transistor CT in the first mode, the control transistor CT may be turned off. Accordingly, the first pixel PX1 may not emit light.

Referring to FIG. 14, the gate terminal CG of the control transistor CT may receive the turn-on voltage VON in the second mode. When the turn-on voltage VON is provided to the gate terminal CG of the control transistor CT, the control transistor CT may be turned on. While the sixth transistor T6 and the control transistor CT are turned on, the first pixel PX1 may emit light.

Figure 15:
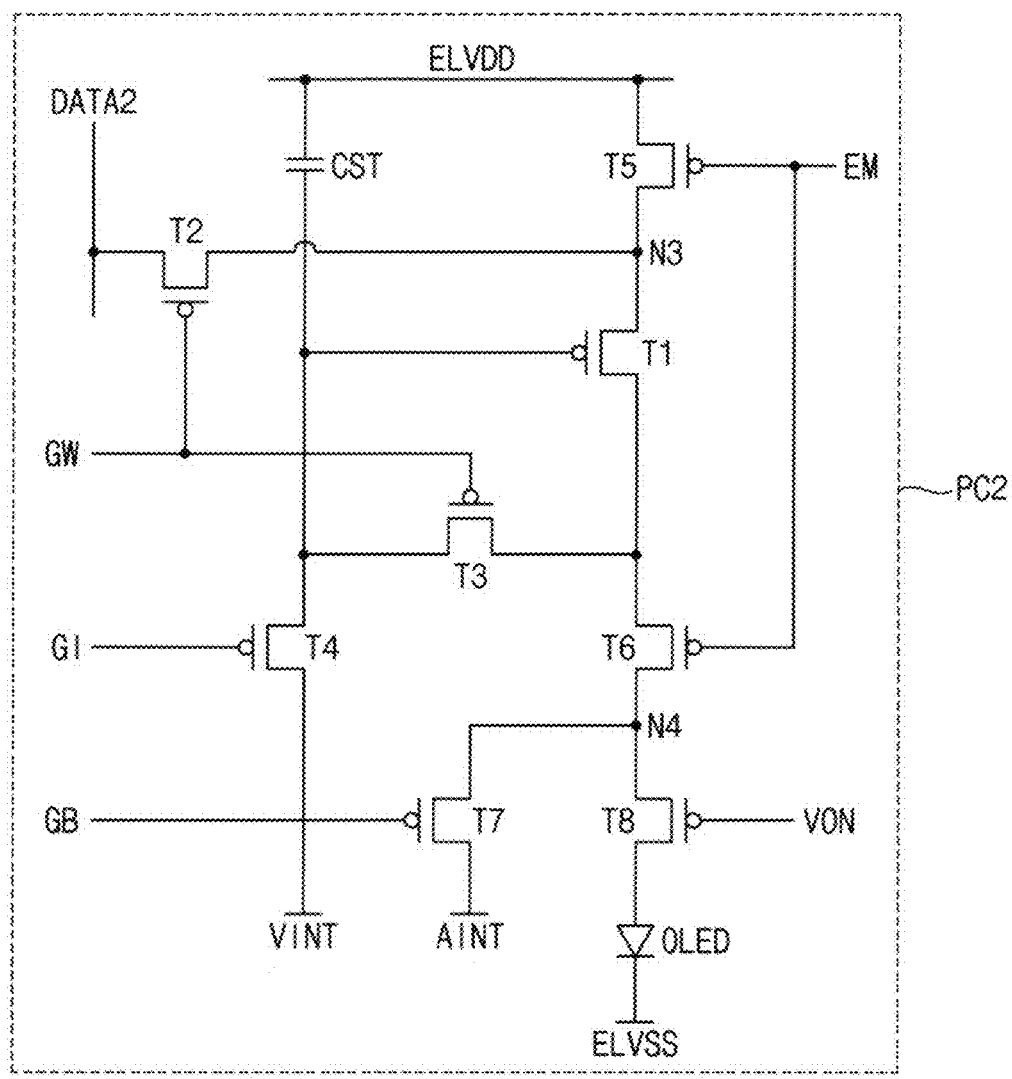
FIG. 15 is a circuit diagram illustrating a second pixel circuit included in the display device of FIG. 12.

FIG. 15 is a circuit diagram illustrating a second pixel circuit included in the display device of FIG. 12. Particularly, FIG. 15 is a circuit diagram illustrating the second pixel circuit driven in the first mode and the second mode.

Referring to FIG. 15, the second pixel PX2 may be driven through the second pixel circuit PC2. The second pixel circuit PC2 may include a plurality of transistors, at least one capacitor, and at least one organic light emitting diode. In an embodiment, the circuit structure of the second pixel circuit PC2 may be substantially the same as the circuit structure of the first pixel circuit PC1. Hereinafter, any repetitive detailed description of the same or like elements of the second pixel circuit PC2 as those of the first pixel circuit PC1 will be omitted or simplified.

In an embodiment, the second pixel circuit PC2 may include a first transistor T1, a second transistor T2, a third transistor T3, a fourth transistor T4, a fifth transistor T5, a sixth transistor T6, a seventh transistor T7, an eighth transistor T8, a storage capacitor CST, and an organic light emitting diode OLED. In such an embodiment, the second transistor T2, the third transistor T3, the fourth transistor T4, the seventh transistor T7, the storage capacitor CST, and the organic light emitting diode OLED may be substantially the same as those described above.

The first transistor T1 may include a gate terminal, a first terminal (e.g., a source terminal), and a second terminal (e.g., a drain terminal). The gate terminal of the first transistor T1 may be electrically connected to the storage capacitor CST. The first terminal of the first transistor T1 may be connected to a third node N3. The first terminal of the first transistor T1 may receive the second data voltage DATA2. The second terminal of the first transistor T1 may be electrically connected to the organic light emitting diode OLED through a fourth node N4 (for example, the second terminal of the first transistor T1 may be electrically connected to the organic light emitting diode OLED through the sixth transistor T6 and the eighth transistor T8). The first transistor T1 may generate a driving current based on a voltage difference between the gate terminal and the third node N3.

The eighth transistor T8 may include a gate terminal, a first terminal (e.g., a source terminal), and a second terminal (e.g., a drain terminal). The gate terminal of the eighth transistor T8 may receive the turn-on voltage VON in the first mode and the second mode. The first terminal of the eighth transistor T8 may be connected to the fourth node N4. The second terminal of the eighth transistor T8 may be connected to the organic light emitting diode OLED.

When the turn-on voltage VON is provided to the gate terminal of the eighth transistor T8 in the first mode and the second mode, the eighth transistor T8 may be turned on. Accordingly, while the fifth transistor T5 and the sixth transistor T6 are turned on, the second pixel PX2 may emit light.

As described herein, embodiments of the display device 10, 20 and 30 according to the invention may be driven in the first mode and the second mode. The first pixel PX1 may not emit light in the first mode, and the first pixel PX1 may emit light in the second mode. Accordingly, the viewing angle of the image displayed on the display device 10, 20 or 30 may be reduced, and the privacy of a user who uses the display device 10, 20 or 30 may be protected. In such embodiments, the first transistor T1 of the first pixel circuit PC1 may be turned off to prevent the first pixel PX1 from emitting light in the first mode. Accordingly, the controller 500 and the data voltage output part 201 may process image data in a same manner in the first and second modes. Accordingly, since the display device 10, 20 or 30 may not process image data differently according to the first and second modes, power consumption of the display devices 10, 20, and 30 may be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising a switching circuit and a first pixel circuit electrically connected to the switching circuit,
    wherein the switching circuit outputs a turn-off voltage to a first node in a first mode and outputs an initialization voltage to the first node in a second mode, and
    wherein the first pixel circuit comprises:
        a first transistor including a gate terminal electrically connected to the first node, a first terminal electrically connected to a second node, and a second terminal electrically connected to an organic light emitting diode; and
        a second transistor including a gate terminal which receives a gate signal, a first terminal which receives a data voltage, and a second terminal electrically connected to the second node.

2. The display device of claim 1, wherein the switching circuit comprises:
    a first switching transistor which provides the turn-off voltage to the first node in the first mode; and
    a second switching transistor which provides the initialization voltage to the first node in the second mode.

3. The display device of claim 2, wherein the first switching transistor comprises:
    a gate terminal which receives a turn-on voltage in the first mode;
    a first terminal electrically connected to the first node; and
    a second terminal which receives the turn-off voltage.

4. The display device of claim 3, wherein the second switching transistor comprises:
    a gate terminal which receives the turn-on voltage in the second mode;
    a first terminal electrically connected to the first node; and
    a second terminal which receives the initialization voltage.

5. The display device of claim 4, wherein the switching circuit further includes a switch, and
    wherein the switch comprises:
        a first terminal which receives the turn-on voltage; and
        a second terminal electrically connected to the gate terminal of the first switching transistor in the first mode, and electrically connected to the gate terminal of the second switching transistor in the second mode.

6. The display device of claim 1, wherein
    the turn-off voltage has a positive voltage level, and
    the initialization voltage has a negative voltage level.

7. The display device of claim 6, wherein an absolute value of a voltage level of the turn-off voltage is greater than an absolute value of a voltage level of the initialization voltage.

8. The display device of claim 6, wherein a voltage level of the turn-off voltage is in a range of about 6 V to about 8 V.

9. The display device of claim 6, wherein a voltage level of the initialization voltage is in a range of about −4 V to about −2 V.

10. The display device of claim 1, wherein the first transistor is turned off in the first mode.

11. The display device of claim 1, further comprising a second pixel circuit,
    wherein the second pixel circuit comprises:
        a first transistor including a gate terminal which receives the initialization voltage in the first mode and the second mode, a first terminal electrically connected to a third node, and a second terminal electrically connected to an organic light emitting diode; and
        a second transistor including a gate terminal which receives the gate signal, a first terminal which receives a data voltage, and a second terminal electrically connected to the third node.

12. The display device of claim 11, wherein a circuit structure of the first pixel circuit is the same as a circuit structure of the second pixel circuit.

13. A display device comprising a first pixel circuit,
    wherein the first pixel circuit comprises:
        a first emission transistor including a gate terminal which receives a turn-off voltage in a privacy protection mode and receives an emission driving signal in a normal mode, a first terminal which receives a high power voltage, and a second terminal electrically connected to a first node;

a first transistor including a gate terminal which receives an initialization voltage, a first terminal electrically connected to the first node, and a second terminal electrically connected to an organic light emitting diode through a second node; and a second transistor including a gate terminal which receives a gate signal, a first terminal which receives a first data voltage, and a second terminal electrically connected to the first node.

14. The display device of claim 13, wherein the first pixel circuit further comprises:

a second emission transistor including a gate terminal which receives the turn-off voltage in the privacy protection mode and receives the emission driving signal in the normal mode, a first terminal electrically connected to the second node, and a second terminal electrically connected the organic light emitting diode.

15. The display device of claim 13, wherein the first emission transistor is turned off in the privacy protection mode.

16. The display device of claim 13, further comprising a second pixel circuit, wherein the second pixel circuit comprises:

a first emission transistor including a gate terminal which receives the emission driving signal in the privacy protection mode and the normal mode, a first terminal which receives the high power voltage, and a second terminal electrically connected to a third node;

a first transistor including a gate terminal which receives the initialization voltage, a first terminal electrically connected to the third node, and a second terminal electrically connected to an organic light emitting diode; and a second transistor including a gate terminal which receives the gate signal, a first terminal which receives a second data voltage, and a second terminal electrically connected to the third node.

17. The display device of claim 16, wherein a circuit structure of the first pixel circuit is the same as a circuit structure of the second pixel circuit.

18. A display device comprising a first pixel circuit, wherein the first pixel circuit comprises:

a first transistor including a gate terminal, a first terminal electrically connected to a first node, and a second terminal electrically connected to a second node;

a second transistor including a gate terminal which receives a gate signal, a first terminal which receives a data voltage, and a second terminal electrically connected to the first node; and a control transistor including a gate terminal which receives a turn-off voltage in a privacy protection mode and receives a turn-on voltage in a normal mode, a first terminal electrically connected to the second node, and a second terminal electrically connected to an organic light emitting diode.

19. The display device of claim 18, further comprising a second pixel circuit, wherein the second pixel circuit comprises:

a first transistor including a gate terminal, a first terminal electrically connected to a third node, and a second terminal electrically connected to a fourth node;

a second transistor including a gate terminal which receives a gate signal, a first terminal which receives a data voltage, and a second terminal electrically connected to the third node; and an eighth transistor including a gate terminal which receives the turn-on voltage in the privacy protection mode and the normal mode, a first terminal electrically connected to the fourth node, and a second terminal electrically connected to an organic light emitting diode.

* * * * *